US007008272B2

(12) United States Patent
Blossfeld

(10) Patent No.: US 7,008,272 B2
(45) Date of Patent: Mar. 7, 2006

(54) ELECTRICAL CONTACT

(75) Inventor: Mike Blossfeld, South Lyon, MI (US)

(73) Assignee: TRW Automotive U.S. LLC, Livonia, MI (US)

( * ) Notice: Subject to any disclaimer, the term of this patent is extended or adjusted under 35 U.S.C. 154(b) by 0 days.

(21) Appl. No.: 10/691,913

(22) Filed: Oct. 23, 2003

(65) Prior Publication Data
US 2005/0090155 A1    Apr. 28, 2005

(51) Int. Cl.
H01R 13/42    (2006.01)
(52) U.S. Cl. .......................................... 439/751; 439/82
(58) Field of Classification Search ................ 439/751, 439/82, 943, 78, 84, 873
See application file for complete search history.

(56) References Cited

U.S. PATENT DOCUMENTS 5,038,252 A * 8/1991 Johnson ...................... 361/792
5,823,830 A * 10/1998 Wurster ....................... 439/751
6,077,128 A    6/2000 Maag et al.
6,309,259 B1 * 10/2001 Yamashita ................... 439/742

FOREIGN PATENT DOCUMENTS

EP    0451674 B1    10/1991

* cited by examiner

Primary Examiner—Ross Gushi
(74) Attorney, Agent, or Firm—Tarolli, Sundheim, Covell & Tummino L.L.P.

(57) ABSTRACT

A compliant pin (10) is adapted to be pressed into a through-hole (12) of a printed circuit board (14) and have electrical contact with opposing surfaces of a side wall (16) of the through-hole. The compliant pin (10) includes a portion (30) insertable in the through-hole (12) that includes spaced deflectable beam portions (32) having outer surfaces (54 and 56) spaced apart a distance greater than the spacing of the opposing surfaces of the side wall (16). The beam portions (32) engage the side wall (16) and deflect toward each other when the portion (30) is inserted in the through-hole (12) and provide a frictional engagement between the beam portions and the side wall. The frictional engagement provides a retention force for retaining the portion (30) in the through-hole (12). The portion (30) includes an opening (50) that extends through the portion and defines inner surfaces (52) of said beam portions (32) opposite the outer surfaces (54 and 56). The inner surfaces (52) consist essentially of a plurality of blended cylindrical surfaces (60, 62, 64, 66, 68).

11 Claims, 2 Drawing Sheets

ELECTRICAL CONTACT

TECHNICAL FIELD

The present invention relates to an electrical contact. More particularly, the present invention relates to an electrical contact for being pressed into a through-hole of a printed circuit board.

BACKGROUND OF THE INVENTION

Electrical contacts for providing a variety of different electrical connections are widely known. One type of electrical contact provides an electrical connection between components mounted on a circuit board and electrically conductive traces on the circuit board. These electrical contacts may take the form of pins that are electrically connected to plated-through-holes of the circuit board or to electrically conductive pads of the circuit board.

SUMMARY OF THE INVENTION

The present invention relates to a compliant pin that is adapted to be pressed into a through-hole of a printed circuit board and have electrical contact with opposing surfaces of a side wall of the through-hole. The compliant pin includes a portion insertable in the through-hole that includes spaced deflectable beam portions having outer surfaces spaced apart a distance greater than the spacing of the opposing surfaces of the side wall. The beam portions engage the side wall and deflect toward each other when the portion is inserted in the through-hole and provide a frictional engagement between the beam portions and the side wall. The frictional engagement provides a retention force for retaining the portion in the through-hole. The portion includes an opening that extends through the portion and defines inner surfaces of said beam portions opposite the outer surfaces. The inner surfaces consist essentially of a plurality of blended cylindrical surfaces.

The present invention also relates to a compliant pin adapted to be pressed into a through-hole of a printed circuit board and have electrical contact with opposing surfaces of a side wall of the through-hole. The compliant pin includes a portion insertable in the through-hole and engagable with the opposing surfaces of the side wall to provide a frictional engagement between the portion and the side wall. The frictional engagement provides a retention force of at least four pounds for retaining the portion in the through-hole and has a thickness no greater than 0.4 millimeters.

The present invention further relates to an electrical contact adapted to be pressed into a through-hole of a printed circuit board and have electrical contact with a surface defining the through-hole. The contact includes a portion for engaging the surface of the printed circuit board defining the through-hole and providing a frictional engagement with the surface. The frictional engagement provides a retention force for retaining the portion in the through-hole. The portion has an opening extending through the portion and intersecting opposite surfaces of the portion. The opening is defined by opposite beam portions of the portion that deflect when the contact is pressed into the through-hole. The beam portions have surfaces that define the opening. The surfaces consist essentially of a series of cylindrical surfaces on each of the beam portions and define the opening.

BRIEF DESCRIPTION OF THE DRAWINGS

The foregoing and other features of the invention will become more apparent to one skilled in the art upon consideration of the following description of the invention and the accompanying drawings in which.

DESCRIPTION OF EMBODIMENTS

Figure 1:
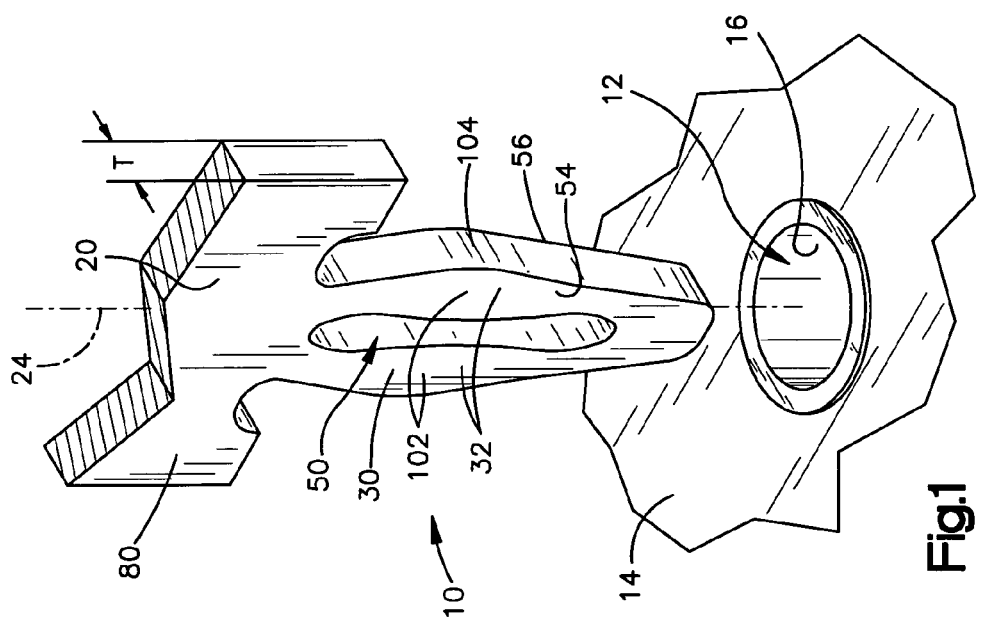
FIG. 1 is a perspective view of an electrical contact according to the present invention.

Referring to FIG. 1, an electrical contact 10 is connectable with a through-hole 12. In the embodiment illustrated in FIG. 1, the through-hole 12 extends through a printed circuit board 14. It will be appreciated, however, that the through-hole 12 could extend through or into any desired object with which a connection with the contact 10 is desired.

The contact 10 is press fit into the through-hole 12 and engages an electrically conductive side wall 16 of the through-hole. For the printed circuit board 14 of the embodiment illustrated in FIG. 1, the through-hole 12 is a plated-through-hole in which the side wall 16 is plated or otherwise coated with an electrically conductive material, such as copper, nickel, silver, gold, tin-lead, or a combination or alloy thereof.

Figure 2:
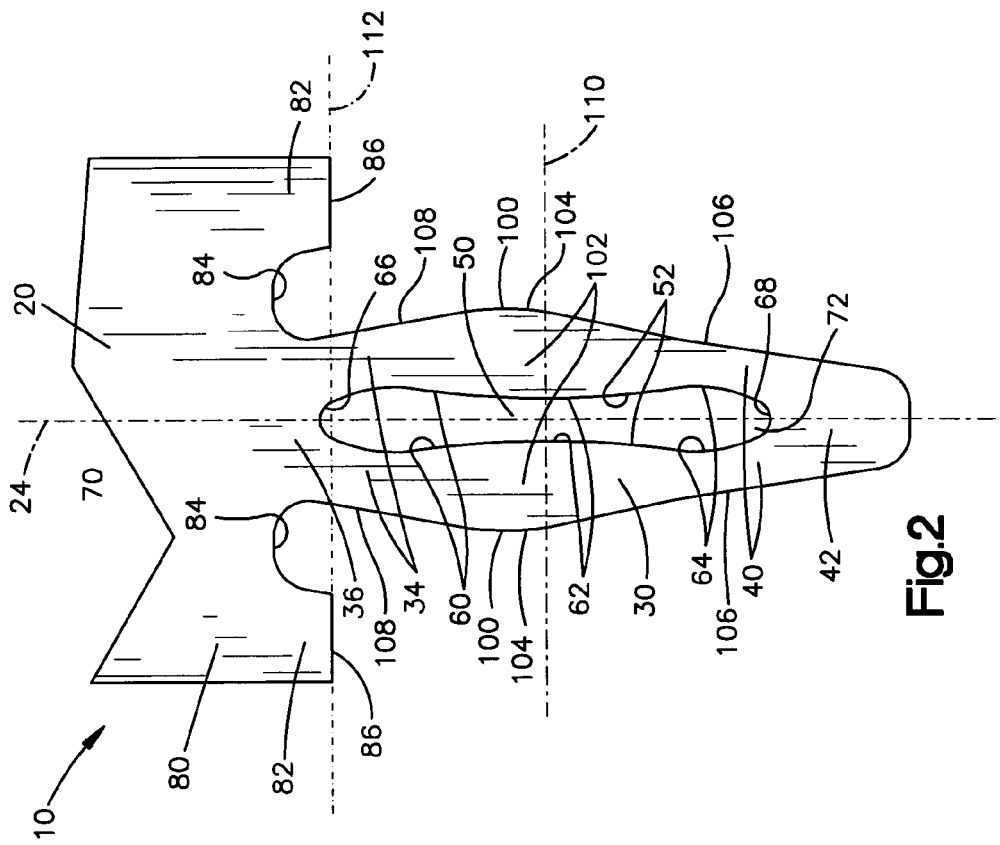
FIG. 2 is a front elevation view of the electrical contact of FIG. 1.

Referring to FIGS. 1 and 2, the electrical contact 10 may include a portion 20 for interfacing with a component (not shown) with which an electrical connection is to be established with the through-hole 12 via the contact. The component may be any device or object with which an electrical connection may be desired, such as a switch, module, integrated circuit, solid state device, discrete device, wire or cable, etc.

The electrical contact 10 includes a pin portion 30 and a positioning portion 80 that are aligned with each other and centered on a longitudinal axis 24 of the contact. The interface portion 20 may also be aligned with the pin portion 30 and positioning portion 80 and centered on the axis 24.

The pin portion 30 comprises what may be referred to as a compliant connector pin or a compliant pin. Compliant pins are given this name because they deflect, deform, or otherwise comply with a hole or aperture into which they are press fitted in order to form an interference fit. This interference fit helps connect the compliant pin to a member in which the hole or aperture extends. The pin portion 30 includes a pair of spaced beam portions 32. As shown in FIG. 2, the beam portions 32 may be spaced symmetrically with respect to the axis 24. The beam portions 32 each have first end portions 34 (FIG. 2) that merge with each other at an interface end 36 of the pin portion 30. The interface end 36 is located proximate the component interface portion 20 of the electrical contact 10. The beam portions 32 each have second end portions 40, opposite the first end portions 34, that merge with each other at terminal insertion end 42 of the pin portion 30.

The pin portion 30 includes an opening 50 that extends between and intersects opposite surfaces 54 and 56 of the pin portion 30. The opening 50 is defined by opposing inner surfaces 52 of the beam portions 32. Conversely, the inner surfaces 52 of the beam portions 32 may be considered as being defined by the opening 50. The inner surfaces 52 consist of a series of cylindrical surfaces. More specifically, each inner surface 52 includes a first cylindrical surface 60, a second cylindrical surface 62, and a third cylindrical surface 64. As shown in FIG. 2, the first cylindrical surfaces 60 are concave surfaces and presented facing each other. The second cylindrical surfaces 62 are convex surfaces presented facing each other. The third cylindrical surfaces 64 are concave surfaces presented facing each other.

The inner surfaces 52 share a fourth cylindrical surface 66 that extends between and interconnects the opposing first surfaces 60 of the beams 32. The fourth cylindrical surface 66 helps define a terminal upper end portion 70 of the opening 50. The inner surfaces 52 also share a fifth cylindrical surface 68 that extends between and interconnects the opposing third surfaces 64 of the beams 32. The fifth cylindrical surface 68 helps define a terminal lower end portion 72 of the opening 50.

Each of the cylindrical surfaces 60, 62, 64, 66, and 68 has a radius and a length. According to the present invention, the radius and length of each cylindrical surface 60, 62, 64, 66, and 68 selected so that each cylindrical surface is blended with its adjacent cylindrical surfaces. By blended, it is meant that the inner surfaces 52 are formed in their entirety by the cylindrical surfaces 60, 62, 64, 66, and 68. In other words, the inner surfaces 52 defining the opening 50 consist only of cylindrical surfaces. For example, the first cylindrical surfaces 60 are blended with their respective second cylindrical surfaces 62 and also with the fourth cylindrical surface 66, which extends between them.

The beam portions 32 each include an outer surface 100 that are presented facing outward, that is, away from each other and away from the axis 24. The outer surfaces 100 that help define an outer surface of the pin portion 30. The outer surfaces 100 may include a combination of cylindrical, flat, or curved surfaces that are blended or intersect each other to form an outer contour of the pin portion 30. Also, as viewed in FIG. 1, the outer surface of the pin portion 30 intersects the surfaces 54 and 56 at sharp corners. These intersections could, however, be rounded. As viewed in FIG. 2, the contour of the pin portion 30 is such that the interface end 36 and insertion end 42 have a narrowed or tapered configuration. The pin portion 30 tapers outward from the axis 24 or widens between the interface end 36 and insertion end 42.

The pin portion 30 has an interface portion 102 that includes respective portions of the beam portions 32. The interface portion 102 includes an interface surface 104 of each of the outer surfaces 100 of the beam portions 32. The interface surfaces 104 include the widest portion of the pin portion 30 as measured along a lateral axis 110 of the pin portion, which extends perpendicular to the longitudinal axis 24. The interface surfaces 104 are cylindrical in the region of the lateral axis 110 and merge with an insertion surface 106 that extends along the insertion end 42 of the pin portion 30. The interface surfaces 104 also merge with respective surfaces 108 that extend tangentially between the interface surfaces and the curved cutouts 84.

The interface surfaces 104 are positioned generally opposite the second cylindrical surfaces 62 of the beam portions 32. The interface portion 102 of the pin portion 30 thus includes portions of each of the beam portions 32 that are widened in comparison with the remainder of the beam portions.

The positioning portion 80 is positioned adjacent the interface end 36 of the pin portion 30. The positioning portion 80 may include a pair of leg portions 82 spaced from each other on opposite sides of the pin portion 30. The leg portions 82 are partially defined by curved cutouts 84 positioned on opposite sides of the pin portion 30. The cutouts 84 may also help define the interface end 36 of the pin portion 30. Each leg portion 82 includes a flat base surface 86 that extends perpendicular to the axis 24.

The contact 10 is constructed of an electrically conductive material, such as a metal alloy. The contact 10 may, for example, be stamped from a metal alloy sheet stock material using a die that is cut to form the desired configuration. The metal alloy sheet stock material may be heat treated or otherwise treated to provide a particular hardness and may be coated or otherwise treated to provide corrosion resistance.

One particular type of metal that may be used to construct the contact 10 is ASTM Specification No. B591, which is a tin-brass alloy having the following nominal composition: 89.5% copper, 8% zinc, 2.25% tin, 0.13% nickel, 0.13% iron, and 0.03% phosphorous. Such an alloy is commercially available from the Olin Corporation of Norwalk, Conn., which markets the alloy as Olin Alloy No. 4552. With a spring hardened temper, the ASTM B591 alloy has a tensile strength of 95–110 ksi, a nominal yield strength of 100 ksi, and a nominal elongation of 4%.

Another type of metal that may be used to construct the contact 10 is a phosphor-bronze alloy having the following nominal composition: 95.5% copper, 4.2% tin, 0.15% nickel, 0.10% iron, and 0.03% phosphorous. Such an alloy is commercially available from the Olin Corporation of Norwalk, Conn., which markets the alloy as Olin Alloy No. 5118. With a spring hardened temper, Olin Alloy No. 5118 has a tensile strength of 105–119 ksi, a nominal yield strength of 107 ksi, and a nominal elongation of 5%.

Another type of metal that may be used to construct the contact 10 is ASTM Specification No. B103, which is a phosphor-bronze alloy having the following nominal composition: 91.9% copper, 8% tin, and 0.1% phosphorous. Such an alloy is commercially available from the Olin Corporation of Norwalk, Conn., which markets the alloy as Olin Alloy No. 521. With a spring hardened temper, the ASTM B103 alloy has a tensile strength of 105–119 ksi, a nominal yield strength of 106 ksi, and a nominal elongation of 6%.

Other copper alloys, such as other tin-brass alloys and other phosphor-bronze alloys, as well as alloys of other metals, such as stainless steel, may also be used to construct the contact 10. These metals may be tempered or otherwise treated to provide a desired hardness, tensile strength, yield strength, etc.

Figure 3A:
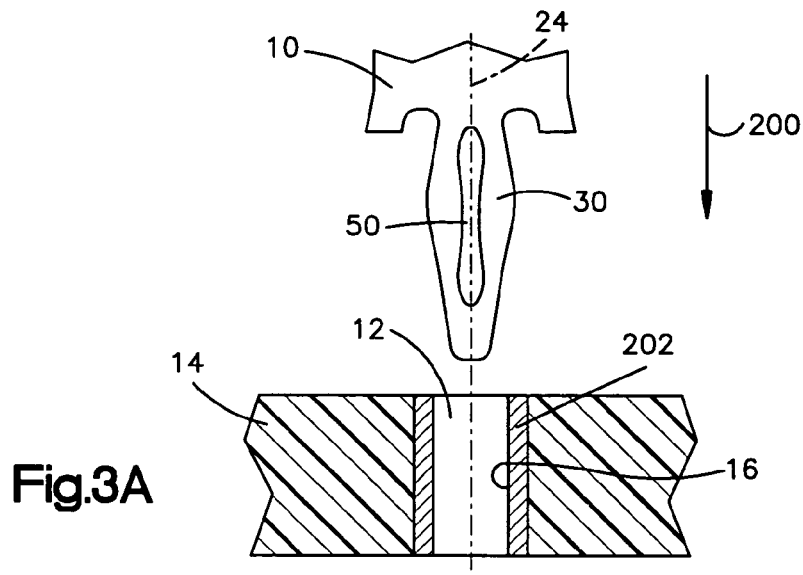
FIGS. 3A–3C are magnified elevation views illustrating the installation of electrical contact of FIGS. 1 and 2.
Figure 3B:
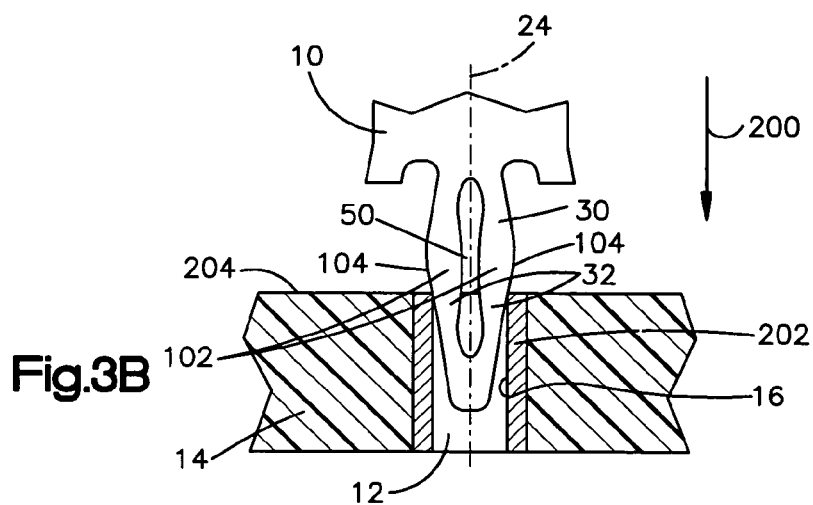
Figure 3C:
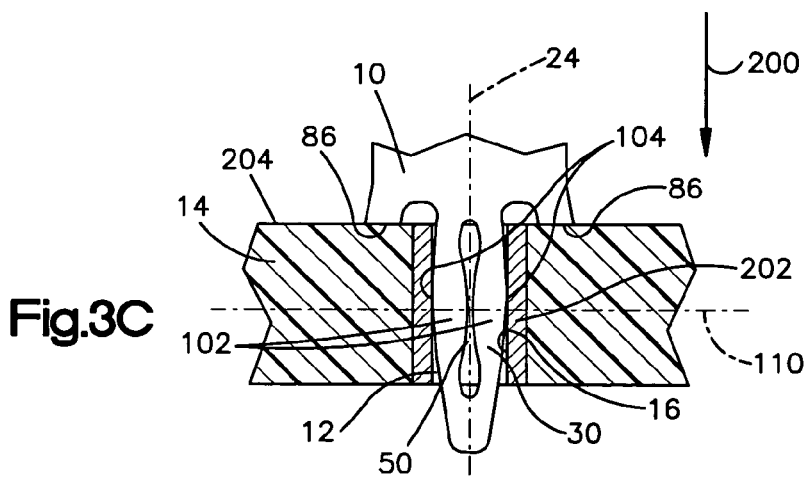

The contact 10 of the present invention may be installed in a quick and reliable manner without the use of solder or other materials, such as adhesives or fasteners. This is shown in FIGS. 3A–3C. Referring to FIG. 3A, the contact 10 is positioned with the pin portion 30 presented toward the printed circuit board 14. The contact 10 is directed in a downward direction indicated generally by the arrow labeled 200 toward the through-hole 12 in the circuit board 14. As described above and shown in FIGS. 3A–3C, the side wall 16 of the through-hole 12 is formed with an electrically conductive material 202 (e.g., copper, silver, gold, nickel, tin-lead, or combinations or alloys thereof).

Referring to FIG. 3B, as the contact 10 moves in the downward direction 200, the interface surfaces 104 of the beams 32 engage the printed circuit board 14. More specifically, the interface surfaces 104 of the beam portions 32 engage diametrically opposite locations on the side wall 16 of the through-hole 12 adjacent the intersection of the side wall and an upper surface 204 of the circuit board 14. As shown in FIG. 3B, the interface portions 102 of the pin portion 30 form an interference with the through-hole 12.

More specifically, an interference is formed between the interface surfaces 104 of the beam portions 32 and the side wall 16.

Referring to FIG. 3C, as the contact 10 moves farther in the downward direction 200, the beams 32 are urged toward each other as a result of normal forces exerted on the interface portions 102 by the side wall 16 of the through-hole 12. As the pin portion 30 enters the through-hole 12, the beam portions 32 deflect toward each other in a direction generally along the lateral axis 110. Also, as the contact 10 moves farther in the downward direction 200, the interface surfaces 104 of the beam portions 32 slide past the intersection of the side wall 16 and the upper surface 204 of the printed circuit board 14. Once the interface portions 102 enter the through-hole 12, the interface surfaces 104 slide along the side wall 16.

When the beam portions 32 deflect as a result of the pin portion 30 being inserted into the through-hole 12, they exert a force on the side wall 16. This force is caused by the resilience of the material used to construct the contact 10. The material construction of the contact 10 causes the beam portions 32, when deflated toward each other, to have a spring bias that urges the beam portions away from each other and toward the side wall 16. Thus, when the contact 10 is inserted into the through-hole 12 and the beam portions 32 are urged toward each other, the beam portions are biased in an opposite direction into engagement with the side wall 16 of the through-hole 12. This causes a frictional engagement between the interface surfaces 104 of the beam portions 32 and the side wall 16. Since the side wall 16 may be plated or otherwise coated with an electrically conductive material, this engagement may also result in an electrically conductive connection between the contact 10 and the side wall and thereby between the circuit board 14 and any component connected with the contact.

As the pin portion 30 is urged into the through-hole 12, the side wall 16 may also be deformed as the interfaces portions 102 cut into or gouge the electrically conductive material 202. This deformation may help promote or enhance the frictional engagement between the interface portions 102 and the side wall 16. It will be appreciated that the amount of frictional engagement between the beam portions 32 and the side wall 16 can be adjusted to desired levels by altering the material construction of the contact 10 and/or the side wall and also by altering the amount of interference between the interface portions 102 and the side wall.

As the contact 10 is moved in the downward direction 200 into the installed condition of FIG. 3C, the lower surfaces 86 of the leg portions 82 engage the upper surface 204 of the circuit board 14. This helps prevent over-insertion of the contact 10 into the through-hole 12. This also helps ensure that the contact 10 is placed in a desired position relative to the circuit board 14 when in the installed condition. This may help place a component connected with the contact 10, such as a switch, in a desired position relative to the circuit board 14.

The positioning portion 80 helps determine and maintain the axial position of the pin portion 30 in the through-hole 12 when fully inserted. More specifically, the positioning portion 80 helps to limit insertion of the pin portion 30 in the through-hole 12 and thereby helps determine the axial position of the pin portion when fully inserted in the through-hole 12. The frictional engagement between the pin portion 30 and the side wall 16 helps provide a retention force that helps retain the contact 10 in the installed condition. "Retention force" refers to the degree to which the frictional engagement between the pin portion 30 (i.e., the interface portions 102) and the side wall 16 prevents removal of the contact 10 once fully inserted in the through-hole 12. To measure the retention force exhibited by the contact 10, a measurement is made as to the amount of force, applied to the contact 10 in a direction generally parallel to the axis 24, that is required to remove the contact from the through-hole 12 once the contact is fully inserted in the through-hole.

The contact 10 has a thickness that is measured perpendicular to the axes 24 and 110 and is indicated generally at T in FIG. 1. According to the present invention, the configuration of the contact 10, combined with the material construction of the contact, allows the contact to be constructed from a relatively thin sheet of material (e.g., the materials listed above) while maintaining a desired retention force. For example, the configuration of the contact 10 may permit the use of a material that is as thin as 0.25–0.50 millimeters or less. This is because the opening, being formed by the blended cylindrical surfaces 60, 62, 64, 66, and 68, provides the interface portions 102 with a cross-sectional area that is large in comparison with the remainder of the beam portions 32.

Because the interface portions 102 have this large cross-sectional area, the beam portions 32 are strengthened and stiffened in the area of the interface portions. This helps increase the resilience of the beam portions 32, which increases the frictional engagement between the interface portions 102 and the side wall 16 and thus helps increase the retention force exhibited by the contact 10 when the contact 10 is fully inserted in the through-hole 12.

When the pin portion 30 of the contact 10 is inserted in the through-hole 12, the beam portions 32 are stressed as a result of being deflected toward each other. The interface portions 102, making up the widest portion of the pin portion 30, are deflected the greatest distance when the contact 10 is inserted in the through-hole 12. The interface portions 102 may thus be subjected to higher stresses than the remainder of the beam portions 32. The beam portions 32, having the contoured configuration defined in part by the blended radiuses of the opening 50, help spread out the stress uniformly over the interface portions 102. Incorporation of the blended radiuses avoids having surfaces defining the opening 50 that have sharp corners or intersections that may act as stress risers in the beam portions 32. This helps prevent overstressing the beam portions 32, which could result in part failure, and also helps prevent plastic deformation of the beam portions, which could result in a reduced retention force.

The increase in retention force realized through the incorporation of the blended radius configuration of the opening 50, which helps define the beam portions 32. This, in turn, allows for providing a contact 10 that exhibits a desired retention force while having a relatively thin thickness. In one example embodiment using the contact 10 configuration of FIGS. 1–3C, the contact has a thickness of 0.24–0.40 millimeters while providing a retention force of 4–6 pounds. In this configuration, an insertion force of about 10 pounds may be required to insert the contact 10 in the through-hole 12.

Referring to FIG. 2, a datum line 112 extends parallel to the axis 112 and coplanar with the lower surfaces 86 of the leg portions 82. In the example embodiment of the contact 10, the pin portion 30 may have a length measured parallel to the axis 24 from the datum line 112 to the terminal tip of the insertion end 42 of about 3.22 millimeters.

The first cylindrical surfaces 60 may have respective radiuses of about 5.1 millimeters and respective axes positioned about 1.19 millimeters from the datum line 112 as measured parallel to the axis 24. The second cylindrical surfaces 62 may have respective radiuses of about 0.83 millimeters and respective axes positioned about 0.36 millimeters from the datum line 112 as measured parallel to the axis 24. The third cylindrical surfaces 64 may have respective radiuses of about 0.83 millimeters and respective axes positioned about 2.02 millimeters from the datum line 112 as measured parallel to the axis 24. The fourth cylindrical surface 66 may have a radius of about 0.11 millimeters and respective axes positioned about 0.05 millimeters from the datum line 112 as measured parallel to the axis 24. The fifth cylindrical surface 68 may have a radius of about 0.11 millimeters and respective axes positioned about 2.33 millimeters from the datum line 112 as measured parallel to the axis 24.

The interface surfaces 104 may have respective radiuses of about 1.56 millimeters. The width of the pin portion 30, measured parallel to the axis 110 between the respective apexes of the interface surfaces 104, may be about 1.24 millimeters. The width of the pin portion 30, measured parallel to the axis 110 at the insertion end 42 of the pin portion, may be about 0.40 millimeters. The spacing between the opposing first cylindrical surfaces 60, measured parallel to the axis 110, may be about 0.24 millimeters.

The interface surfaces 104 may have respective radiuses of about 1.56 millimeters and respective axes positioned about 0.97 millimeters from the datum line 112 as measured parallel to the axis 24. The insertion surfaces 106 may have respective radiuses of about 1.71 millimeters and respective axes positioned about 2.24 millimeters from the datum line 112 as measured parallel to the axis 24.

In the example embodiment, the through-hole 12 may have a diameter of about 1.0 millimeters. This results in an interference between the width of the pin portion 30 and the through-hole 12 of about 0.24 millimeters. Thus, when the contact 10 is inserted into the through-hole 12, the deflection of the beam portions 32 combined with the extent to which the interface portions 102 dig or gouge into the side wall 16 absorbs this interference.

From the above description of the invention, those skilled in the art will perceive improvements, changes and modifications. Such improvements, changes and modifications within the skill of the art are intended to be covered by the appended claims.

Having described the invention, the following is claimed:

1. A compliant pin adapted to be pressed into a through-hole of a printed circuit board and have electrical contact with opposing surfaces of a side wall of the through-hole, said compliant pin comprising:

a portion insertable in the through-hole, said portion comprising spaced deflectable beam portions, each beam portion including an interface portion having a cylindrical outer surface, said outer surfaces of said interface portions being spaced apart a distance greater than the spacing of the opposing surfaces of the side wall, said outer surfaces of said interface portions engaging the side wall and said beam portions deflecting toward each other when said portion is inserted in the through-hole, said interface portions frictionally engaging the side wall and providing a retention force for retaining said portion in the through-hole;

said portion comprising an opening extending through said portion and defining inner surfaces of said beam portions, said inner surfaces consisting essentially of a plurality of blended cylindrical surfaces free from flat surfaces;

said interface portions each including a cylindrical inner surface comprising a portion of said inner surface of its respective beam portion, said inner surface and outer surface of each interface portion being convex and facing away from each other and free from flat surfaces, said interface portions having a cross-sectional area that is greater than a cross-sectional area of a reminder of said beam portions.

2. The compliant pin recited in claim 1, wherein said inner surfaces of said beam portions each include a central cylindrical surface, said central cylindrical surfaces being convex and presented facing each other, said central cylindrical surfaces defining a central portion of said opening.

3. The compliant pin recited in claim 1, wherein said compliant pin has a longitudinal axis and a lateral axis extending perpendicular to the longitudinal axis, said cylindrical surfaces having axes that extend perpendicular to both the longitudinal axis and the lateral axis of said pin.

4. The compliant pin recited in claim 1, further comprising a positioning portion comprising first and second leg portions positioned on laterally opposite sides of said portion, each of said legs having a surface for engaging a surface of the printed circuit board adjacent the through-hole and limiting insertion of said portion in the through-hole to help place said portion at a predetermined axial position in the through-hole.

5. The compliant pin recited in claim 1, wherein said frictional engagement provides a retention force of at least four pounds for retaining said portion in the through-hole, said portion having a thickness of no greater than 0.4 millimeters.

6. The compliant pin recited in claim 5, wherein the thickness of said portion is measured perpendicular to both a longitudinal axis of said portion and a lateral axis of said portion.

7. The compliant pin recited in claim 5, wherein said portion has a length of about 3.22 millimeters and a width of about 1.24 millimeters measured between said outer surfaces of said beam portions, the through-hole having a diameter of about 1.0 millimeter.

8. A compliant pin adapted to be pressed into a through-hole of a printed circuit board and have electrical contact with opposing surfaces of a side wall of the through-hole, said compliant pin comprising:

a portion insertable in the through-hole, said portion comprising spaced deflectable beam portions, each beam portion including an interface portion having a cylindrical outer surface, said outer surfaces of said interface portions being spaced apart a distance greater than the spacing of the opposing surfaces of the side wall, said outer surfaces engaging the side wall and said beam portions deflecting toward each other when said portion is inserted in the through-hole, said interface portions frictionally engaging the side wall and providing a retention force for retaining said portion in the through-hole;

said portion comprising an opening extending through said portion and defining inner surfaces of said beam portions, said inner surfaces consisting essentially of a plurality of blended cylindrical surfaces free from flat surfaces;

said interface portions each including a cylindrical inner surface comprising a portion of said inner surface of its respective beam portion, said inner surface and outer surface of each interface portion being convex and facing away from each other and being free from flat surfaces, said interface portions having a cross-sectional area that is greater than a cross-sectional area of a reminder of said beam portions; and wherein said compliant pin extends completely through said through hole.

9. The compliant pin recited in claim 8 wherein said compliant pin extends through said through hole until said opening of said portion projects below the bottom of said printed circuit board.

10. The compliant pin recited in claim 8 wherein said inner surfaces of said beam portions each include a central cylindrical surface, said central cylindrical surfaces being convex and presented facing each other, said central cylindrical surfaces defining a central portion of said opening.

11. A compliant pin adapted to be pressed into a through-hole of a printed circuit board and have electrical contact with opposing surfaces of a side wall of the through-hole, said compliant pin comprising:

a portion insertable in the through-hole;

an opening extending through said portion, said opening defining a surface consisting essentially of a plurality of blended cylindrical surfaces free from flat surfaces; and spaced deflectable beam portions at least partially defined by said opening, each beam portion comprising an interface portion with an outer surface that extends the length of said interface portion and an opposite inner surface that extends the length of said interface portion, said outer and inner surfaces of said interface portions each being cylindrical, free from flat surfaces and convex, said outer surfaces facing away from each other, said outer surface and said inner surface of each interface portion facing away from each other;

said outer surfaces being spaced apart a distance greater than the spacing of the opposing surfaces of the side wall and engaging the side wall causing said beam portions to deflect toward each other when said portion is inserted in the through-hole, said outer surfaces frictionally engaging the side wall and providing a retention force for retaining said portion in the through-hole.

\* \* \* \* \*

UNITED STATES PATENT AND TRADEMARK OFFICE
CERTIFICATE OF CORRECTION

PATENT NO. : 7,008,272 B2 Page 1 of 1
APPLICATION NO. : 10/691913
DATED : March 7, 2006
INVENTOR(S) : Mike Blossfeld It is certified that error appears in the above-identified patent and that said Letters Patent is hereby corrected as shown below:

Column 9, line 5, before "of" change "reminder" to --remainder--.

Signed and Sealed this

Fourth Day of July, 2006

JON W. DUDAS
*Director of the United States Patent and Trademark Office*